United States Patent
Kim et al.

(10) Patent No.: US 10,056,138 B1
(45) Date of Patent: Aug. 21, 2018

(54) ELECTRONIC DEVICE

(71) Applicant: SK hynix Inc., Icheon (KR)

(72) Inventors: Hyun-Jeong Kim, Yongin (KR);
Myoung-Sub Kim, Seongnam (KR);
Tae-Hoon Kim, Seongnam (KR);
Seung-Hwan Lee, Seoul (KR);
Woo-Tae Lee, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/605,661

(22) Filed: May 25, 2017

Related U.S. Application Data

(60) Provisional application No. 62/344,882, filed on Jun. 2, 2016.

(51) Int. Cl.
*G11C 11/00* (2006.01)
*G11C 13/00* (2006.01)
*G06F 3/06* (2006.01)

(52) U.S. Cl.
CPC ........ *G11C 13/0026* (2013.01); *G06F 3/0604* (2013.01); *G06F 3/0656* (2013.01); *G06F 3/0659* (2013.01); *G06F 3/0679* (2013.01); *G11C 13/0028* (2013.01)

(58) Field of Classification Search
CPC ... G11C 11/00; G11C 13/0026; G06F 3/0604; G06F 3/0656; G06F 3/0659; G06F 3/0679
USPC ... 365/148, 46, 94, 100, 113, 129, 158, 163; 257/2–5, 9, 296, 310, E21.35, E31.047, 257/E27.006
See application file for complete search history.

(56) References Cited

U.S. PATENT DOCUMENTS

| | | | |
|---|---|---|---|
| 2012/0155168 A1* | 6/2012 | Kim | G11C 5/14 365/185.03 |
| 2013/0010522 A1* | 1/2013 | Kanzawa | G11C 13/0007 365/148 |
| 2013/0223131 A1* | 8/2013 | Takagi | G11C 13/0007 365/148 |
| 2013/0258748 A1 | 10/2013 | Kim et al. | |
| 2014/0372713 A1* | 12/2014 | Castro | G11C 8/10 711/154 |

FOREIGN PATENT DOCUMENTS

KR  10-2014-0028303 A  3/2014

* cited by examiner

*Primary Examiner* — Harry W Byrne

(57) ABSTRACT

Provided is an electronic device including a semiconductor memory. The semiconductor memory may include a memory region comprising a plurality of memory cells disposed at respective intersections between a plurality of row lines and a plurality of column lines, the plurality of row lines extending in a first direction, the plurality of column lines extending in a second direction crossing the first direction; first and second row drivers arranged on one side and the other side of the memory region in the first direction, respectively, and driving a common row line corresponding to a row address among the plurality of row lines; and a column driver driving a common column line corresponding to a column address among the plurality of column lines, wherein the first and second row drivers are coupled to the common row line.

20 Claims, 6 Drawing Sheets

ELECTRONIC DEVICE

CROSS-REFERENCE TO RELATED APPLICATIONS

The present application claims priority to U.S. Provisional Patent Application No. 62/344,882, filed on Jun. 2, 2016, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device includes a semiconductor memory having improved reliability.

In an implementation, there is provided an electronic device including a semiconductor memory. The semiconductor memory may include a memory region comprising a plurality of memory cells disposed at respective intersections between a plurality of row lines and a plurality of column lines, the plurality of row lines extending in a is first direction, the plurality of column lines extending in a second direction crossing the first direction; first and second row drivers arranged on one side and the other side of the memory region in the first direction, respectively, and driving a common row line corresponding to a row address among the plurality of row lines; and a column driver driving a common column line corresponding to a column address among the plurality of column lines, wherein the first and second row drivers are coupled to the common row line.

The column driver may include first and second column drivers arranged on one side and the other side of the memory region in the second direction, respectively. The first and second column drivers may be coupled to the common column line. Each of the plurality of memory cells may include a selecting element having a non-linear current-voltage characteristic; and a variable resistance element coupled to the selecting element. The selecting element may include any one selected from the group consisting of a MIT (Metal Insulator Transition) element, a MIEC (Mixed Ion-Electron Conducting) element, and an OTS (Ovonic Threshold Switching) element. The variable resistance element may include any one of a ferromagnetic material, a metal oxide material, a phase-change material, a ferrodielectric material, and a combination thereof.

The electronic device may further comprising a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further comprising a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further comprising a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further comprising a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further comprising a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In an implementation, an electronic device may include a memory region comprising a plurality of memory cells disposed at respective intersections between a plurality of row lines and a plurality of column lines that cross each other; a row driver driving a common row line corresponding to a row address among the plurality of row lines in first and second access operations; and a column driver driving a common column line corresponding to a column address among the plurality of column lines in the first and second access operations, wherein the second access operation is performed subsequently to the first access operation, and one or more of the memory cells selected in the first access operation are the same as those selected in the second access operation.

The first and second access operations may include a program operation and a read operation, respectively. Each of the plurality of row lines extends in a first direction, wherein the row driver may include a first row driver driving the common row line in the first access operation; and a second row driver driving the common row line in the second access operation, and wherein the first and second row drivers are arranged on one side and the other side of the memory region in the first direction, respectively. The first and second row drivers may be coupled to the common row line. Each of the plurality of column lines extends in a second direction, wherein the column driver may include a first column driver driving the common column line in the first access operation; and a second column driver driving the common column line in the second access operation, and wherein the first and second column drivers are arranged on one side and the other side of the memory region in the second direction, respectively. The first and second column drivers may be coupled to the common column line. Each of the plurality of memory cells may include a selecting element having a non-linear current-voltage characteristic; and a variable resistance element coupled to the selecting element. The selecting element may include any one selected from the group consisting of a MIT (Metal Insulator Transition) element, a MIEC (Mixed Ion-Electron Conducting) element, and an OTS (Ovonic Threshold Switching) element. The variable resistance element may include any one of a ferromagnetic material, a metal oxide material, a phase-change material, a ferrodielectric material, and a combination thereof.

DETAILED DESCRIPTION

Figure 1:
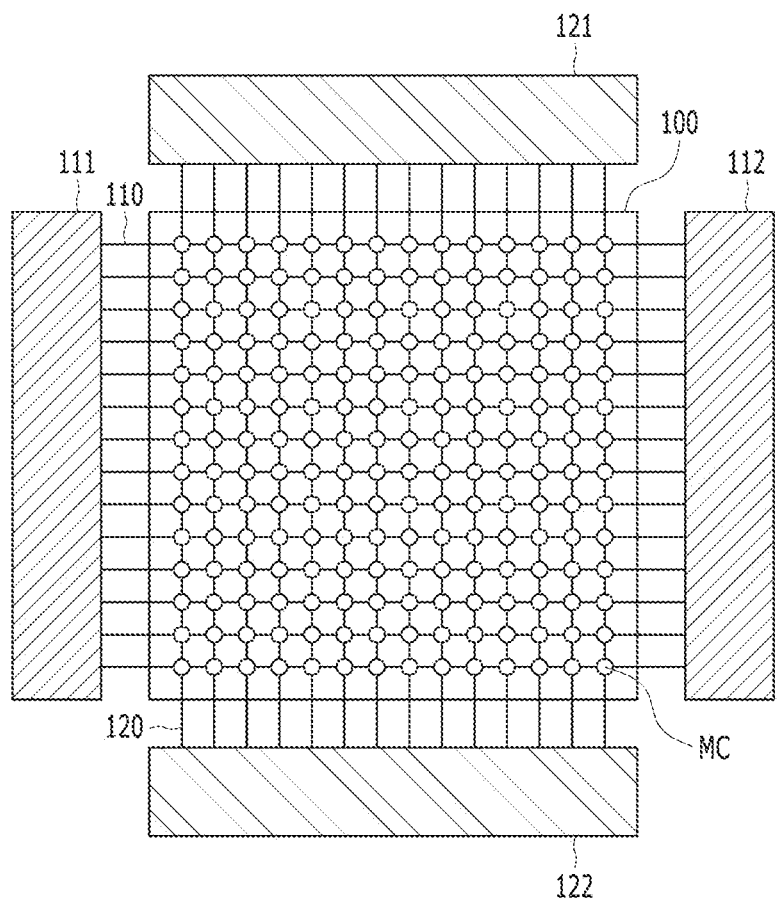
FIG. 1 is a plan view illustrating a semiconductor memory in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

The following implementations provide an electronic device including a semiconductor memory having improved reliability. The semiconductor memory may include means capable of preventing an occurrence of a failure in program and read operations.

More particularly, the semiconductor memory in accordance with implementations will be explained with an example in which a variable resistance element using a resistance change is provided as a storage element.

In a semiconductor memory including a variable resistance element, distances from a row driver or a column driver to memory cells differ from each other depending on the positions of the memory cells in a memory cell array. When a voltage or current is applied to each of the memory cells through the row or column driver, since voltage drops between the row or column driver and the memory cells vary with such different distances, a voltage level or a current magnitude applied across a memory cell may not be sufficiently high to perform a programming operation or a reading operation on the memory cell. As a result, reliability of the semiconductor memory including the variable resistance element may be deteriorated.

Therefore, in accordance with implementations, there is provided an electronic device including a semiconductor memory that is capable of preventing reliability degradation of the semiconductor memory, even though voltage drops vary with different positions of memory cells in a memory cell array of the semiconductor memory.

Figure 2:
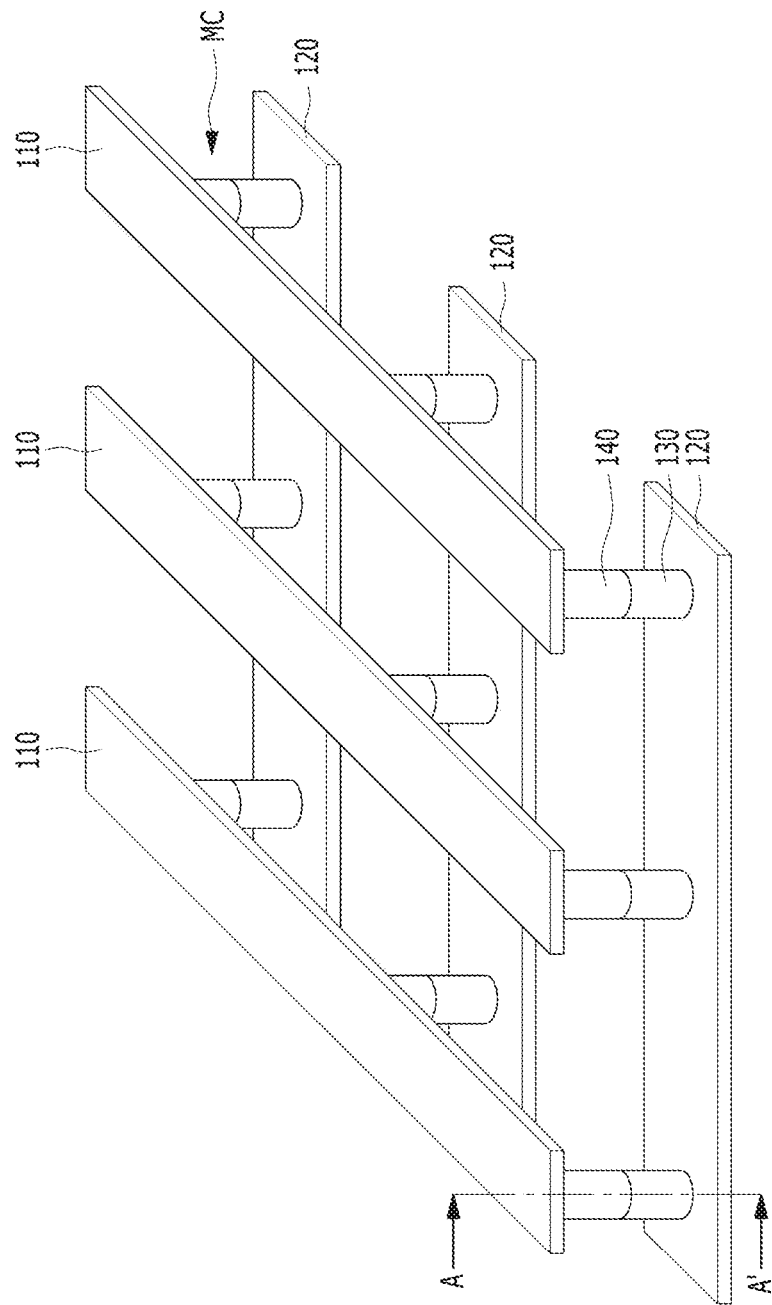
FIG. 2 is a perspective view illustrating a part of a memory region in the semiconductor memory of FIG. 1 in accordance with the implementation.

FIG. 1 is a plan view illustrating a semiconductor memory in accordance with an implementation, and FIG. 2 is a perspective view illustrating a part of a memory region in the semiconductor memory of FIG. 1 in accordance with the implementation.

A memory region 100 of the semiconductor memory in accordance with the implementation shown in FIGS. 1 and 2 may include a plurality of row lines 110 and a plurality of column lines 120 that cross each other and a plurality of memory cells MC formed at the respective intersections of the plurality of row lines 110 and the plurality of column lines 120.

The memory region 100 may include a memory cell array having a cross-point structure. More specifically, the memory region 100 may include any one of a plurality of cell mats or any one of a plurality of banks.

Each of the plurality of row lines 110 and each of the plurality of column lines 120 may serve to apply a voltage or current across both ends of a corresponding memory cell MC. Each of the plurality of row lines 110 and the plurality of column lines 120 may have a single-layer or multilayer structure and include a metal such as Pt, Ir, Ru, Al, Cu, W, Ti, Ta, Co, Ni, or the like or a metal nitride such as TiN, TiCN, TiAlN, TiON, TaN, TaCN, TaAlN, TaON, WN, MoN, or the like.

Each of the plurality of memory cells MC may include a selecting element 130 and a variable resistance element 140 coupled to the selecting element 130. When a magnitude of a voltage applied thereto exceeds a predetermined value, the selecting element 130 may pass a high current and be an on-state. When the magnitude of the voltage is equal to or less than the predetermined value, the selecting element 130 may be an off-state. Specifically, the selecting element 130 may have a non-linear current-voltage characteristic. The selecting element 130 may include a MIT (Metal Insulator Transition) element such as $NbO_2$, $TiO_2$ or the like. Moreover, the selecting element 130 may include a MIEC (Mixed Ion-Electron Conducting) element such as $ZrO_2(Y_2O_3)$, $Bi_2O_3$—$BaO$, $(La_2O_3)_x(CeO_2)_{1-x}$ or the like, or an OTS (Ovonic Threshold Switching) element including a chalcogenide-based material such as $Ge_2Sb_2Te_5$, $As_2Te_3$, $As_2$, $As_2Se_3$ or the like.

The variable resistance element 140 may switch between different resistance states according to a voltage or current applied across the variable resistance element 140 through a corresponding row line 110 and a corresponding column line 120, and may have a single-layer or multilayer structure. The variable resistance element 140 may include any of various materials used for RRAM, PRAM, FRAM, MRAM, STTRAM and the like. The various materials may include a transition metal oxide material, a metal oxide such as a perovskite-based material, a phase change material such as a chalcogenide-based material, a ferrodielectric material, and a ferromagnetic material.

The semiconductor memory in accordance with the implementation shown in FIG. 1 may further include a first row driver 111 and a second row driver 112, which are respectively arranged on one side and the other side of the memory region 100 in a first direction (e.g., a horizontal direction with respect to the orientation of FIG. 1) and drive the row lines 110 respectively corresponding to row addresses. In this implementation, the first row driver 111 and the second row driver 112 may include a row decoder. In an implementation, each of the row lines 110 extends in a direction parallel to the first direction.

The first row driver 111 and the second row driver 112 may jointly drive a certain row line corresponding to any one of the row lines 110, and serve to compensate for a difference in voltage drops due to a difference in distances from the first row driver 111 or the second row driver 112 to memory cells MC coupled to the certain row line. That is, both of the first row driver 111 and the second row driver 112 may be coupled to the certain row line. Hereinafter, the certain row line may be referred to as a 'common row line.'

A distance between a driver and a memory cell is defined as a length of a portion of a corresponding row or column line that couples the driver and the memory cell. In an implementation, lengths of the row lines 110 between the first and second row drivers 111 and 112 are substantially the same. For example, a difference between lengths of any pair of the row lines 110 is less than 5%, 3%, or 1% of an average length of the row lines 110. As a result, the sum of a first length of a first portion of a row line 110 between the first row driver 111 and a memory cell MC and a second length of a second portion of the same row line 110 between the second row driver 112 and the memory cell MC may be a substantially constant value, regardless of the position of the memory cell MC within the memory region 100.

The semiconductor memory in accordance with the implementation shown in FIG. 1 may still further include a first column driver 121 and a second column driver 122, which are respectively arranged on one side and the other side of the memory region 100 in a second direction (e.g., a vertical direction with respect to the orientation of FIG. 1), and drive the column lines 120 respectively corresponding to column addresses. In this implementation, the first column driver 121 and the second column driver 122 may include a column decoder. In an implementation, each of the drive column lines 120 extends in a direction parallel to the second direction. In an implementation, the second direction is perpendicular to the first direction in which each of the row lines 110 extends.

The first column driver 121 and the second column driver 122 may jointly drive a certain column line corresponding to any one of the column lines 120, and serve to compensate for a difference in voltage drops due to a difference in distances from the first column driver 121 or the second column diver 122 to memory cells MC coupled to the certain column line. That is, both of the first column driver 121 and the second column driver 122 may be coupled to the certain column line. Therefore, the sum of a first length of a first portion of the column line 120 between the first column driver 121 and a memory cell MC and a second length of a second portion of the column line 120 between the second column driver 122 and the memory cell MC may be a substantially constant value, regardless of the position of the memory cell MC within the memory region 100. Hereinafter, the certain column line may be referred to as a 'common column line.'

Meanwhile, although a single memory region 100 is shown in the implementation of FIG. 1, implementations of the present disclosure are not limited thereto. In other implementations, the semiconductor memory may include a plurality of memory regions 100. Moreover, each of the plurality of memory regions 100 may include drivers corresponding to the first row driver 111, the second row driver 112, the first column driver 121 and the second column driver 122, or adjacent memory regions 100 may share one or more of drivers corresponding to the first row driver 111, the second row driver 112, the first column driver 121 and the second column driver 122 with each other.

The semiconductor memory having the structure described above may include the first and second row drivers 111 and 112 driving the same row line 110 corresponding to the same row address and the first and second column drivers 121 and 122 driving the same column line 120 corresponding to the same column address. As a result, it is possible to compensate for a difference in voltage drops due to a difference in distances from the row and column drivers 111, 112, 121, and 121 to a memory cell MC, depending on the position of the memory cell MC within the memory region 100. An operation of the semiconductor memory in accordance with the implementation shown in FIGS. 1 and 2 will be described in more detail as below.

The semiconductor memory in accordance with the implementation shown in FIGS. 1 and 2 may perform a first access operation and a second access operation subsequent to the first access operation. Here, each of the first access operation and the second access operation may include a program operation and a read operation.

The first access operation may include selecting a particular memory cell MC within the memory region 100 by using the first row driver 111 and the first column driver 121 and performing a program operation, a read operation, or both, on the selected memory cell MC. The second access operation performed subsequently to the first access operation may include re-selecting the memory cell MC, which has been selected in the first access operation, by using the second row driver 112 and the second column driver 122 and performing the program operation, the read operation, or both, on the selected memory cell MC.

That is, the memory cell MC selected in the first access operation is the same as that selected in the second access operation, and for the selected memory cell MC, the program operations and the read operations are performed two times using the first row and column drivers 111 and 121 and then using the second row and column drivers 112 and 122. For example, suppose that the selected memory cell MC is positioned farther from the first row driver 111 than the second row driver 112 along a common row line 110, when a voltage is applied to the selected memory cell MC through the first row driver 111, a distance between the first row driver 111 and the selected memory cell is longer, and thus a first voltage drop between the first row driver 111 and the selected memory cell MC may become great enough to cause a failure in the program or read operation of the first access operation. However, in the second access operation, because the selected memory cell MC is positioned closer to the second row driver 112, a second voltage drop between the second row driver 112 and the selected memory cell MC may be sufficiently small to prevent a failure in the program or read operation of the second access operation. Therefore, even though a difference in the voltage drops according to the position of a memory cell MC within the memory region 100 occurs, it is possible to compensate for the difference using the first and second row and column drivers that sequentially perform the first and second access operations on the memory cell MC. As a result, it is possible to prevent decrease in reliability of the semiconductor memory.

The semiconductor memory in accordance with the implementation shown in FIGS. 1 and 2 of the present disclosure may be applied to diverse electronic devices or systems. FIGS. 3 to 7 show some examples of electronic devices or systems that can implement the semiconductor memory disclosed herein.

Figure 3:
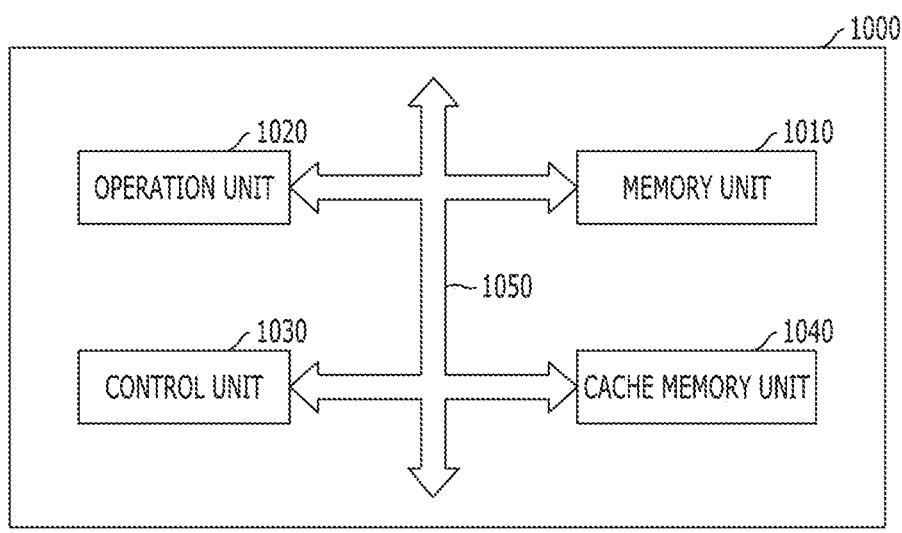
FIG. 3 is an example of configuration diagram of a microprocessor implementing memory circuitry based on the disclosed technology.

FIG. 3 is an example of configuration diagram of a microprocessor implementing memory circuitry based on the disclosed technology.

Figure 7:
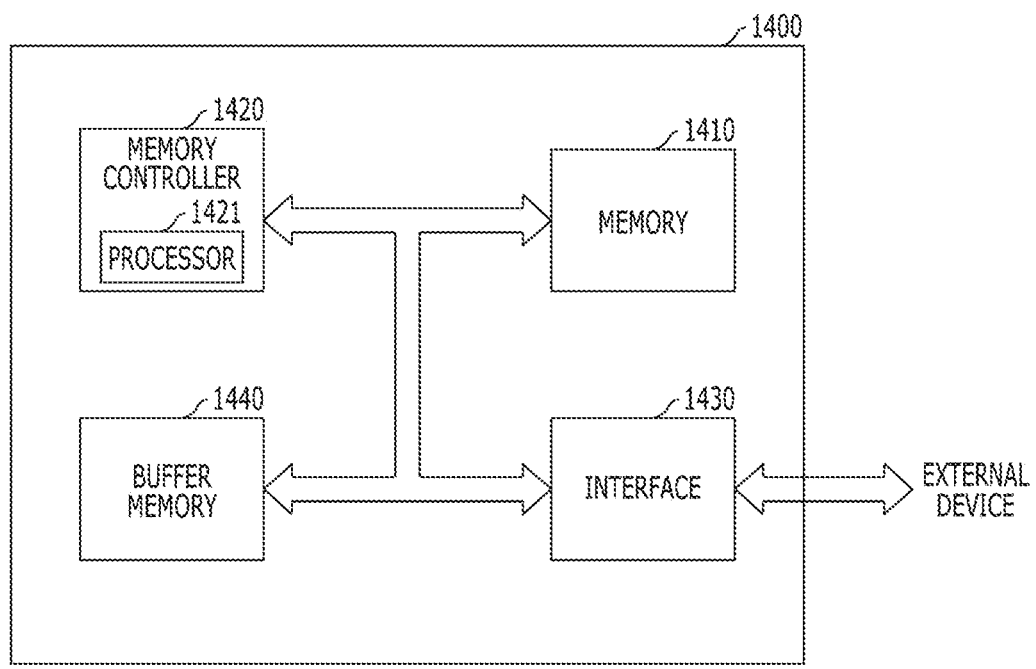
FIG. 7 is an example of configuration diagram of a memory system implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a memory region comprising a plurality of memory cells disposed at respective intersections between a plurality of row lines and a plurality of column lines, the plurality of row lines extending in a first direction, the plurality of column lines extending in a second direction crossing the first direction. The first and second row drivers arranged on one side and the other side of the memory region in the first direction, respectively, and driving a common row line corresponding to a row address among the plurality of row lines. A column driver driving a common column line corresponding to a column address among the plurality of column lines. The first and second row drivers are coupled to the common row line. As a result, it is possible to reliability of the device and compensate for a difference in the voltage drop due to a difference in the line length depending on the position of the memory cell MC within the memory region. That is, it is possible to improve the operating characteristics and reliability of the device. Through this, the memory unit 1010 and the microprocessor 1000 may have improved reliability.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 4:
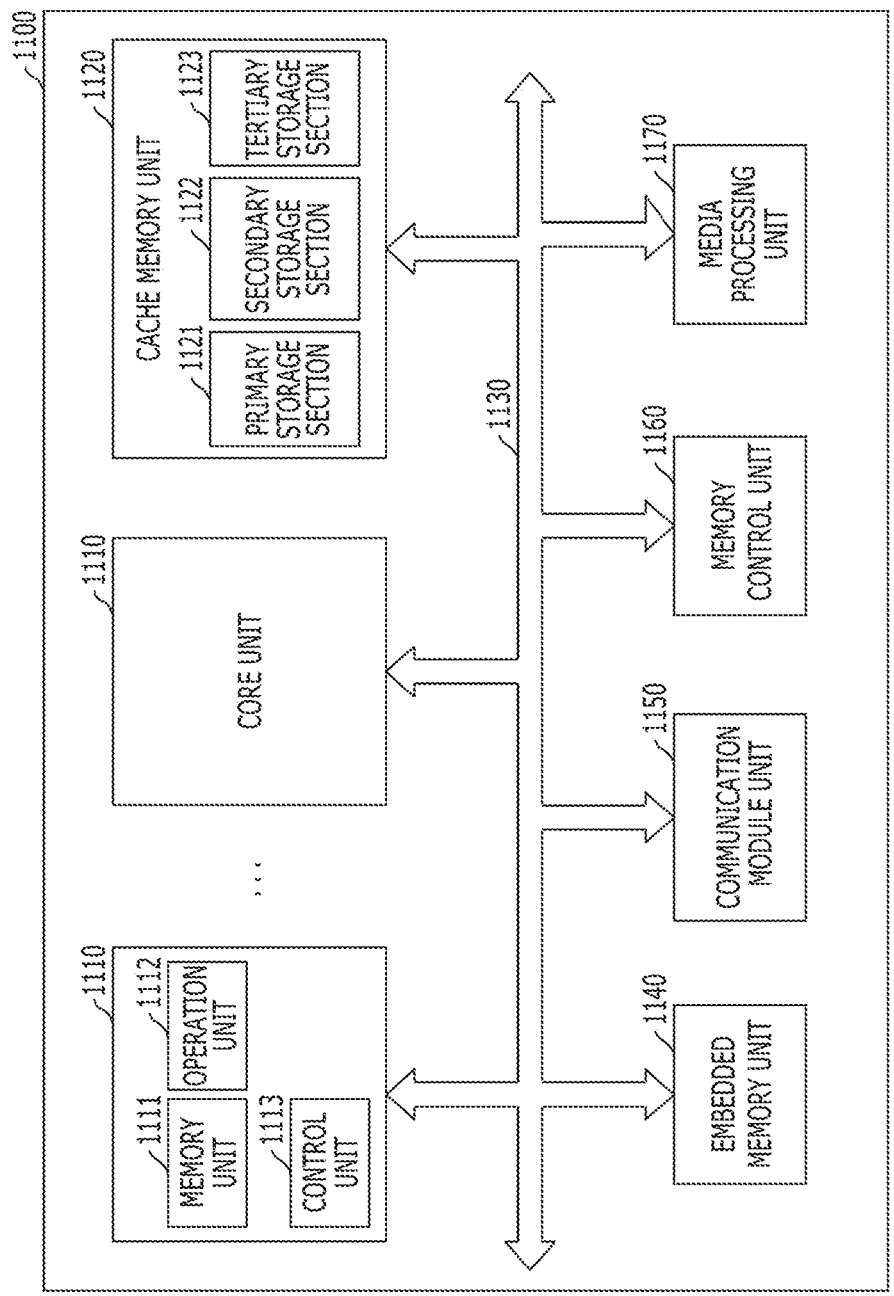
FIG. 4 is an example of configuration diagram of a processor implementing memory circuitry based on the disclosed technology.

FIG. 4 is an example of configuration diagram of a processor implementing memory circuitry based on the disclosed technology.

Referring to FIG. 4, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like.

The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a memory region comprising a plurality of memory cells disposed at respective intersections between a plurality of row lines and a plurality of column lines, the plurality of row lines extending in a first direction, the plurality of column lines extending in a second direction crossing the first direction. The first and second row drivers arranged on one side and the other side of the memory region in the first direction, respectively, and driving a common row line corresponding to a row address among the plurality of row lines. A column driver driving a common column line corresponding to a column address among the plurality of column lines. The first and second row drivers are coupled to the common row line. As a result, it is possible to reliability of the device and compensate for a difference in the voltage drop due to a difference in the line length depending on the position of the memory cell MC within the memory region. That is, it is possible to improve the operating characteristics and reliability of the device. Through this, the cache memory unit 1120 and the processor 1100 may have improved reliability.

Although it was shown in FIG. 4 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 5:
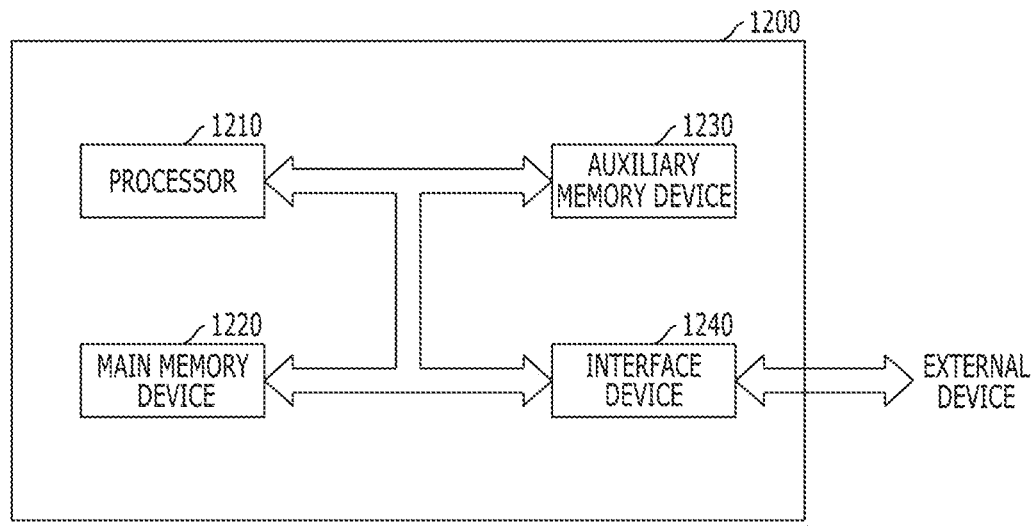
FIG. 5 is an example of configuration diagram of a system implementing memory circuitry based on the disclosed technology.

FIG. 5 is an example of configuration diagram of a system implementing memory circuitry based on the disclosed technology.

Referring to FIG. 5, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a memory region comprising a plurality of memory cells disposed at respective intersections between a plurality of row lines and a plurality of column lines, the plurality of row lines extending in a first direction, the plurality of column lines extending in a second direction crossing the first direction. The first and second row drivers arranged on one side and the other side of the memory region in the first direction, respectively, and driving a common row line corresponding to a row address among the plurality of row lines. A column driver driving a common column line corresponding to a column address among the plurality of column lines. The first and second row drivers are coupled to the common row line. As a result, it is possible to reliability of the device and compensate for a difference in the voltage drop due to a difference in the line length depending on the position of the memory cell MC within the memory region. That is, it is possible to improve the operating characteristics and reliability of the device. Through this, the main memory device 1220 and the system 1200 may have improved reliability.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a memory region comprising a plurality of memory cells disposed at respective intersections between a plurality of row lines and a plurality of column lines, the plurality of row lines extending in a first direction, the plurality of column lines extending in a second direction crossing the first direction. The first and second row drivers arranged on one side and the other side of the memory region in the first direction, respectively, and driving a common row line corresponding to a row address among the plurality of row lines. A column driver driving a common column line corresponding to a column address among the plurality of column lines. The first and second row drivers are coupled to the common row line. As a result, it is possible to reliability of the device and compensate for a difference in the voltage drop due to a difference in the line length depending on the position of the memory cell MC within the memory region. That is, it is possible to improve the operating characteristics and reliability of the device. Through this, the auxiliary memory device 1230 and the system 1200 may have improved reliability.

Also, the auxiliary memory device 1230 may further include a data storage system (see the reference numeral 1300 of FIG. 6) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 6) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 6:
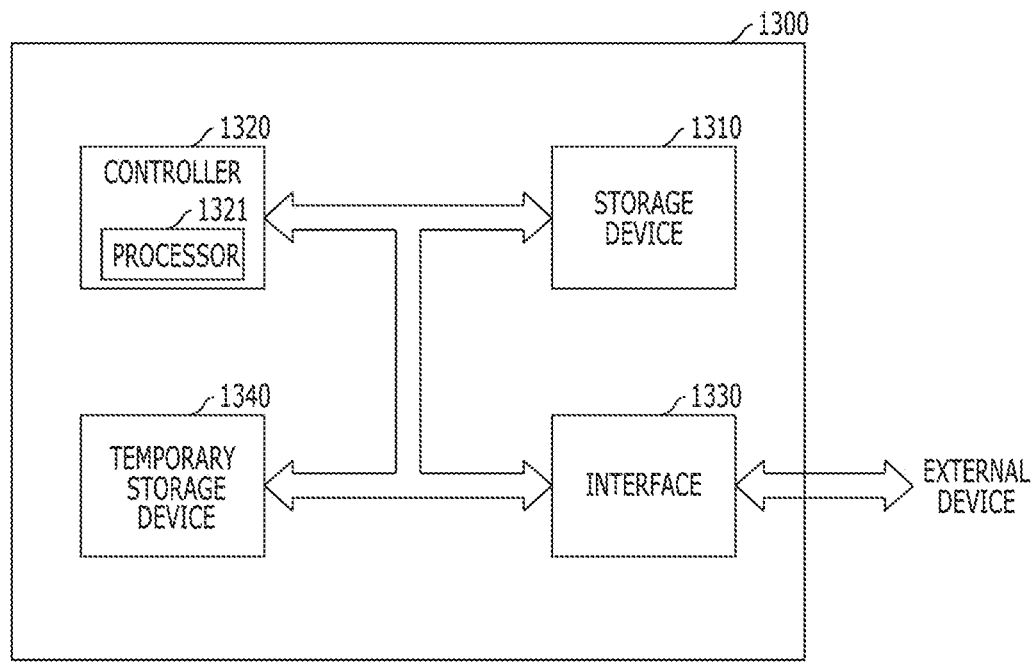
FIG. 6 is an example of configuration diagram of a data storage system implementing memory circuitry based on the disclosed technology.

FIG. 6 is an example of configuration diagram of a data storage system implementing memory circuitry based on the disclosed technology.

Referring to FIG. 6, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include a memory region comprising a plurality of memory cells disposed at respective intersections between a plurality of row lines and a plurality of column lines, the plurality of row lines extending in a first direction, the plurality of column lines extending in a second direction crossing the first direction. The first and second row drivers arranged on one side and the other side of the memory region in the first direction, respectively, and driving a common row line corresponding to a row address among the plurality of row lines. A column driver driving a common column line corresponding to a column address among the plurality of column lines. The first and second row drivers are coupled to the common row line. As a result, it is possible to reliability of the device and compensate for a difference in the voltage drop due to a difference in the line length depending on the position of the memory cell MC within the memory region. That is, it is possible to improve the operating characteristics and reliability of the device. Through this, the temporary storage device 1340 and the data storage system 1300 may have improved reliability.

FIG. 7 is an example of configuration diagram of a memory system implementing memory circuitry based on the disclosed technology.

Referring to FIG. 7, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a memory region comprising a plurality of memory cells disposed at respective intersections between a plurality of row lines and a plurality of column lines, the plurality of row lines extending in a first direction, the plurality of column lines extending in a second direction crossing the first direction. The first and second row drivers arranged on one side and the other side of the memory region in the first direction, respectively, and driving a common row line corresponding to a row address among the plurality of row lines. A column driver driving a common column line corresponding to a column address among the plurality of column lines. The first and second row drivers are coupled to the common row line. As a result, it is possible to reliability of the device and compensate for a difference in the voltage drop due to a difference in the line length depending on the position of the memory cell MC within the memory region. That is, it is possible to improve the operating characteristics and reliability of the device. Through this, the memory 1410 and the memory system 1400 may have improved reliability.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 may include a memory region comprising a plurality of memory cells disposed at respective intersections between a plurality of row lines and a plurality of column lines, the plurality of row lines extending in a first direction, the plurality of column lines extending in a second direction crossing the first direction. The first and second row drivers arranged on one side and the other side of the memory region in the first direction, respectively, and driving a common row line corresponding to a row address among the plurality of row lines. A column driver driving a common column line corresponding to a column address among the plurality of column lines. The first and second row drivers are coupled to the common row line. As a result, it is possible to reliability of the device and compensate for a difference in the voltage drop due to a difference in the line length depending on the position of the memory cell MC within the memory region. That is, it is possible to improve the operating characteristics and reliability of the device. Through this, the buffer memory 1440 and the memory system 1400 may have improved reliability.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 3 to 7 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

In accordance with implementation, since for one memory cell, the program operation or the read operation may be continuously performed two times, it is possible to prevent decrease in reliability due to a voltage drop according to the position of the memory cell within the memory region.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory,
   wherein the semiconductor memory comprises:
   a memory region comprising a plurality of memory cells disposed at respective intersections between a plurality of row lines and a plurality of column lines, the plurality of row lines extending in a first direction, the plurality of column lines extending in a second direction crossing the first direction;
   first and second row drivers arranged on one side and the other side of the memory region in the first direction, respectively, and driving a common row line corresponding to a row address among the plurality of row lines; and
   a column driver driving a common column line corresponding to a column address among the plurality of column lines,
   wherein the first and second row drivers are coupled to the common row line.

2. The electronic device of claim 1, wherein the column driver comprises first and second column drivers arranged on one side and the other side of the memory region in the second direction, respectively.

3. The electronic device of claim 2, wherein the first and second column drivers are coupled to the common column line.

4. The electronic device of claim 1, wherein each of the plurality of memory cells comprises:
   a selecting element having a non-linear current-voltage characteristic; and
   a variable resistance element coupled to the selecting element.

5. The electronic device of claim 4, wherein the selecting element comprises any one selected from the group consisting of a MIT (Metal Insulator Transition) element, a MIEC (Mixed Ion-Electron Conducting) element, and an OTS (Ovonic Threshold Switching) element.

6. The electronic device of claim 4, wherein the variable resistance element comprises any one of a ferromagnetic material, a metal oxide material, a phase-change material, a ferrodielectric material, and a combination thereof.

7. The electronic device according to claim 1, further comprising a microprocessor which includes:
   a control unit configured to receive a signal including a command from an outside of the microprocessor, and performs extracting, decoding of the command, or controlling input or output of a signal of the microprocessor;
   an operation unit configured to perform an operation based on a result that the control unit decodes the command; and
   a memory unit configured to store data for performing the operation, data corresponding to a result of performing the operation, or an address of data for which the operation is performed,
   wherein the semiconductor memory is part of the memory unit in the microprocessor.

8. The electronic device according to claim 1, further comprising a processor which includes:
   a core unit configured to perform, based on a command inputted from an outside of the processor, an operation corresponding to the command, by using data;
   a cache memory unit configured to store data for performing the operation, data corresponding to a result of performing the operation, or an address of data for which the operation is performed; and
   a bus interface connected between the core unit and the cache memory unit, and configured to transmit data between the core unit and the cache memory unit,
   wherein the semiconductor memory is part of the cache memory unit in the processor.

9. The electronic device according to claim 1, further comprising a processing system which includes:
   a processor configured to decode a command received by the processor and control an operation for information based on a result of decoding the command;
   an auxiliary memory device configured to store a program for decoding the command and the information;
   a main memory device configured to call and store the program and the information from the auxiliary memory device such that the processor can perform the operation using the program and the information when executing the program; and
   an interface device configured to perform communication between at least one of the processor, the auxiliary memory device and the main memory device and the outside,
   wherein the semiconductor memory is part of the auxiliary memory device or the main memory device in the processing system.

10. The electronic device according to claim 1, further comprising a data storage system which includes:
    a storage device configured to store data and conserve stored data regardless of power supply;
    a controller configured to control input and output of data to and from the storage device according to a command inputted form an outside;
    a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

11. The electronic device according to claim 1, further comprising a memory system which includes:
- a memory configured to store data and conserve stored data regardless of power supply;
- a memory controller configured to control input and output of data to and from the memory according to a command inputted form an outside;
- a buffer memory configured to buffer data exchanged between the memory and the outside; and
- an interface configured to perform communication between at least one of the memory, the memory controller and the buffer memory and the outside, wherein the semiconductor memory is part of the memory or the buffer memory in the memory system.

12. An electronic device comprising:
- a memory region comprising a plurality of memory cells disposed at respective intersections between a plurality of row lines and a plurality of column lines that cross each other;
- a row driver driving a common row line corresponding to a row address among the plurality of row lines in first and second access operations; and
- a column driver driving a common column line corresponding to a column address among the plurality of column lines in the first and second access operations, wherein the second access operation is performed subsequently to the first access operation, and one or more of the memory cells selected in the first access operation are the same as those selected in the second access operation.

13. The electronic device of claim 12, wherein the first and second access operations each comprise a program operation and a read operation.

14. The electronic device of claim 12, wherein each of the plurality of row lines extends in a first direction, wherein the row driver comprises:
- a first row driver driving the common row line in the first access operation; and
- a second row driver driving the common row line in the second access operation, and wherein the first and second row drivers are arranged on one side and the other side of the memory region in the first direction, respectively.

15. The electronic device of claim 14, wherein the first and second row drivers are coupled to the common row line.

16. The electronic device of claim 12, wherein each of the plurality of column lines extends in a second direction, wherein the column driver comprises:
- a first column driver driving the common column line in the first access operation; and
- a second column driver driving the common column line in the second access operation, and wherein the first and second column drivers are arranged on one side and the other side of the memory region in the second direction, respectively.

17. The electronic device of claim 16, wherein the first and second column drivers are coupled to the common column line.

18. The electronic device of claim 12, wherein each of the plurality of memory cells comprises:
- a selecting element having a non-linear current-voltage characteristic; and
- a variable resistance element coupled to the selecting element.

19. The electronic device of claim 18, wherein the selecting element comprises any one selected from the group consisting of a MIT (Metal Insulator Transition) element, a MIEC (Mixed Ion-Electron Conducting) element, and an OTS (Ovonic Threshold Switching) element.

20. The electronic device of claim 18, wherein the variable resistance element comprises any one of a ferromagnetic material, a metal oxide material, a phase-change material, a ferrodielectric material, and a combination thereof.

* * * * *